United States Patent

Cranston et al.

[15] 3,699,640

[45] Oct. 24, 1972

[54] COMPLIANT BONDING

[72] Inventors: Benjamin H. Cranston, Trenton, N.J.; Michael P. Eleftherion, Yardley, Pa.

[73] Assignee: Western Electric Company Incorporated, New York, N.Y.

[22] Filed: Dec. 1, 1970

[21] Appl. No.: 94,135

[52] U.S. Cl. ..................29/471.1, 29/493, 29/497.5, 29/589, 29/626, 29/628, 228/3, 228/4, 228/44, 269/266

[51] Int. Cl. ............................................B23k 31/02

[58] Field of Search..........29/471.1, 493, 497.5, 589, 29/626, 628; 228/3, 4, 44; 156/480, 498; 269/22, 266

[56] References Cited

UNITED STATES PATENTS

| | | | |
|---|---|---|---|
| 2,407,145 | 9/1946 | Elwin | 29/626 UX |
| 3,254,402 | 6/1966 | Balamuth et al. | 29/497.5 X |
| 3,448,911 | 6/1969 | Cushman | 228/44 |
| 3,501,832 | 3/1970 | Iwata et al. | 29/626 |
| 3,533,155 | 10/1970 | Coucoulas | 29/471.1 |
| 3,541,673 | 11/1970 | Cushman | 29/493 X |
| 3,608,809 | 9/1971 | Cushman | 29/471.1 X |

OTHER PUBLICATIONS

Coucoulas et al., " Compliant Bonding– A New Technique for Joint Microelectronic Components," IEEE Transaction Electron Devices, 9/69, 11pp.

Kurtz, F. J., " Joining Semiconductor Chips to a Decol Interconnection Overlay," IBM Technical Disclosure Bulletin, Vol. 11, No. 3, August 1968.

Schwab et al., " Multichip Bonding," IBM Technical Disclosure Bulletin, Vol. 10, No. 8, 1/68.

*Primary Examiner*—Robert D. Baldwin
*Assistant Examiner*—Ronald J. Shore
*Attorney*—W. M. Kain, R. P. Miller and R. Y. Peters

[57] ABSTRACT

Compliant bonding of beam-leaded semiconductor devices is improved by deforming a compliant member into apertures of a rigid bonding grid during a bonding process. The deformation of the compliant member provides a desired clearance around brittle body portions of the semiconductor devices so that the body portions remain undamaged during bonding. In one example, the deformation takes place during exertion of bonding force and, in another example, just prior to the exertion of the bonding force. In still another example, the deformation is sufficient to cause complete shearing of the compliant member so that direct viewing of the device through the compliant member for alignment purposes can be effected.

12 Claims, 9 Drawing Figures

INVENTORS
B.H. CRANSTON
M.P. ELEFTHERION
BY [signature]
ATTORNEY

COMPLIANT BONDING

BACKGROUND OF THE INVENTION

1. Field of the Invention

The invention relates to compliant bonding beam leaded articles wherein compliant members are formed into apertures of rigid bonding tools to accommodate fragile or brittle portions of the articles during bonding.

2. Description of the Prior Art

When bonding beam-lead transistor and integrated circuit chips to metallic patterns formed on substrates, it is desirable to use a technique known as compliant bonding. Compliant bonding utilizes a deformable compliant member, such as a strip of aluminum, positioned between a rigid heated ram and leads of integrated circuit chips to produce a highly uniform thermocompression bond between the leads and the metallic elements formed on the substrate.

Advantages associated with compliant bonding are quite significant. Some of the advantages are a very uniform distribution of bonding forces over the leads and a virtual elimination of situations in which excessive bonding forces are applied to leads that might cause a reduction of lead strength. These and other advantages as well as a very detailed description of compliant bonding can be had by referring to U.S. Pat. No. 3,533,155 issued to A. Coucoulas on Oct. 13, 1970.

An area of concern in compliant bonding is possible damage to integrated circuit chips because the chips are formed of a body portion of crystalline material, such as silicon, which is usually quite brittle. A compliant bonding member normally cannot be placed directly over these body portions during compliant bonding because the bonding forces transmitted through the compliant bonding member would crack or otherwise damage the brittle body portions. Consequently, compliant bonding members used to bond such brittle chips are provided with apertures large enough so that the body portions of the chips can extend into the apertures during bonding.

Of course, when the chips are bonded to a substrate they must be very accurately located with respect to the metallic patterns on the substrates and, very often many of the chips are placed on one substrate thus complicating the placement problems. It has been the practice in the art to produce compliant bonding members with a pattern of apertures corresponding to the pattern of the chips on the particular substrate to which they are being bonded.

In implementing compliant bonding in situations where accurately located integrated-circuit chips are involved, it has been the practice to pre-position or "-tack" the chips to the substrate prior to the bonding of the chips. After the chips are tacked, a preformed, i.e., an apertured compliant bonding member is placed over the assembly of substrate and "tacked" chips. A heated ram is then pressed onto the compliant bonding member and all of the chips are simultaneously bonded to the substrate.

In this type of bonding, the compliant member needed to be preformed. This preforming was usually in the nature of apertures formed into the member. The apertures were large enough to accommodate brittle body portions of the semiconductor devices so that when bonding forces were applied, the brittle body portions were not subjected to the forces and were thus left undamaged.

When apertures are precut in compliant members for multiple-chip bonding, the apertures must be very accurately positioned with respect to one another. For example, if an aperture is too small or does not have the proper configuration to accept a body portion of a device, the body may be fractured, crushed or cracked. On the other hand, if the aperture is too large or does not have the proper configuration to engage each lead extending from the device, the leads may not be properly engaged and all of the leads may not be properly bonded. As it is not unusual for the body portion of a device to be only 0.014 inch wide by 0.028 inch long and for the leads to only extend 0.003 to 0.005 inch beyond the body of the device, the dimensions of the aperture must be held to very tight tolerances, for example, to $\pm$ 0.0005 inch.

In order to achieve the desired accuracy within such multiple-chip compliant members, it has been necessary to either punch the compliant member or etch the compliant member into the desired configuration.

Etching of the compliant member is quite expensive and becomes an important element of the cost of bonding when each of the compliant members must be discarded after having been used only once.

Punching results in relatively inexpensive compliant members if the quantities of the compliant members to be used are very great. However, if a small production run of a particular configuration is to be made, then, very often, the cost of providing tooling for a punched type of compliant member is prohibitive.

SUMMARY OF THE INVENTION

It is, therefore, an object of the invention to provide a system of compliant bonding wherein simple, flat compliant members can be introduced directly into a bonding process without a need for developing a particular configuration or shape on the compliant member.

This and other objects are achieved by providing methods and apparatus in which, during a bonding operation, a compliant member is deformed into an aperture of a bond-force producing member. This deformation provides clearance for a brittle portion of a device being bonded so that bonding forces can be transmitted through the compliant member to lead portions of the device without damaging the brittle portion.

BRIEF DESCRIPTION OF THE DRAWINGS

Other objects and features of the present invention will be more readily understood from the following detailed description of specific embodiments thereof when read in conjunction with the appended drawings in which.

DETAILED DESCRIPTION

Illustratively, the invention is described in connection with bonding beam-leaded semiconductor devices. It is to be understood, however, that the invention is applicable to the bonding of any article having a fragile or brittle body portion and a ductile bonding portion.

Figure 1:
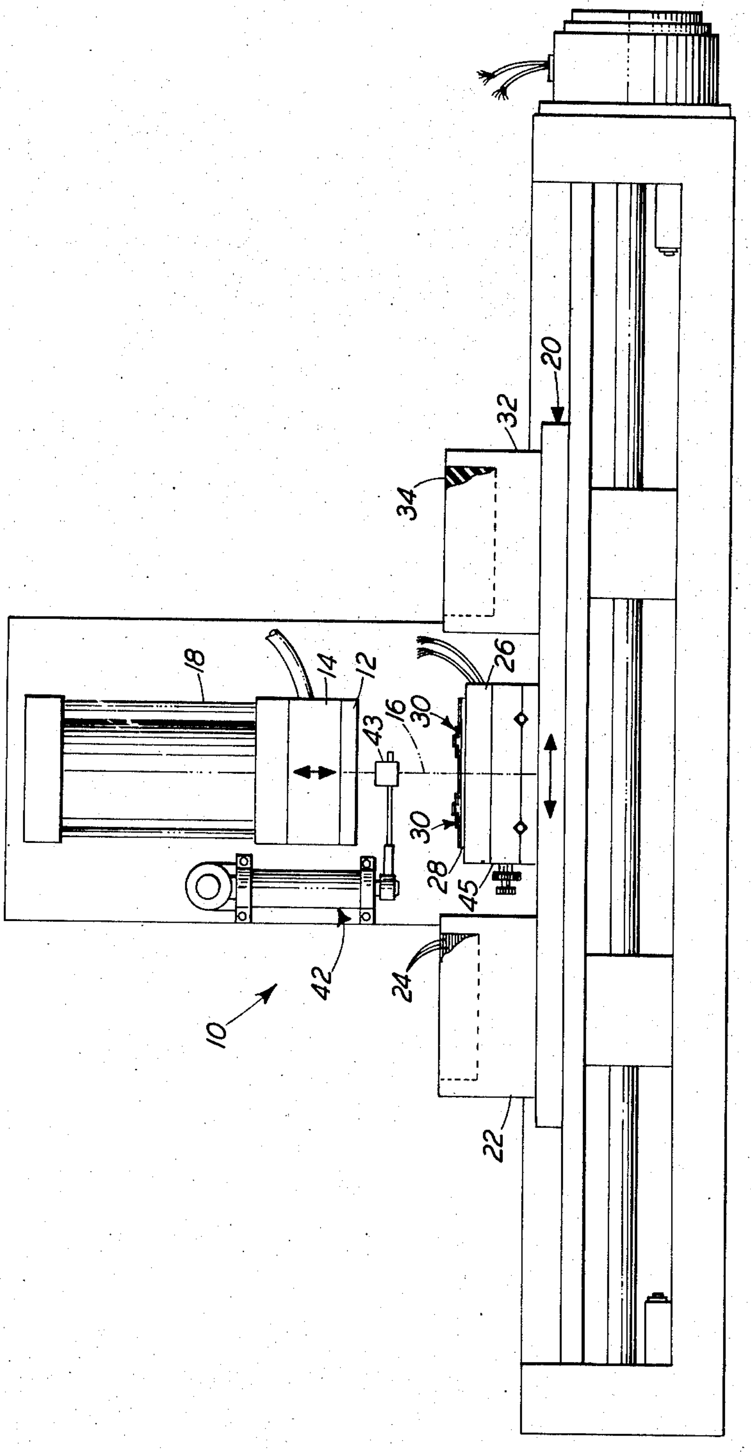
FIG. 1 is an elevational view of a bonding apparatus useful for carrying out the inventive bonding method.

A bonding machine, designated generally by the numeral 10, for performing the inventive method of bonding is illustrated in FIG. 1. The machine 10 includes a bond-force producing member or apertured grid 12 attached to a ram 14, which is movable along a bonding axis 16 under the influence of a conventional air or hydraulic cylinder 18.

Under the ram 14 there is a shuttle table, generally designated by the numeral 20. Mounted on the shuttle table 20 are three support members. A first support member 22 is utilized to hold a stack of sheets of foil, each of which are to be used as a compliant member 24. A second support member 26 is utilized to support a workpiece or substrate 28 onto which other prepositioned workpieces or beam-leaded semiconductor devices, generally designated by the numeral 30, are to be bonded. A third support member 32 is used to support an elastomeric pad 34.

The shuttle table 20 moves back and forth horizontally in the direction of the arrows shown in FIG. 1. By moving the table 20 back and forth, the machine 10 can be made to perform the following sequential operation.

Figure 2:
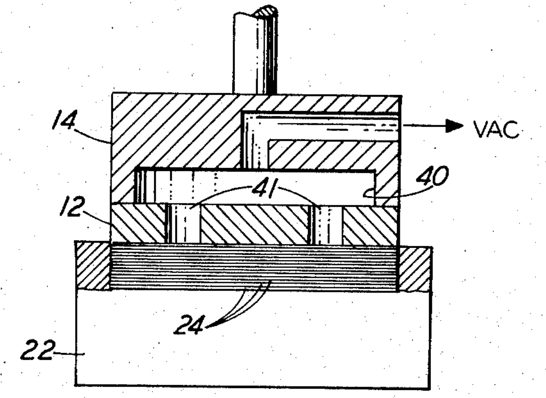
FIG. 2 is an enlarged view of the bonding apparatus of FIG. 1 in a configuration where compliant members are being engaged with a bonding ram.

First of all, the table 20 is moved to the extreme right so that the support member 22 is aligned with the bonding axis 16. The cylinder 18 is extended to place the grid 12 into contact with the topmost one of the compliant members 24 supported on the member 22. Vacuum is applied to an internal chamber 40 (see FIG. 2) of the ram 14. The grid 12 has one or more apertures 41 formed therein, which are connected to the internal chamber 40. The presence of vacuum at the outer surfaces of the apertures 42 causes the topmost compliant member 24 to become engaged with the grid 12.

Figure 3:
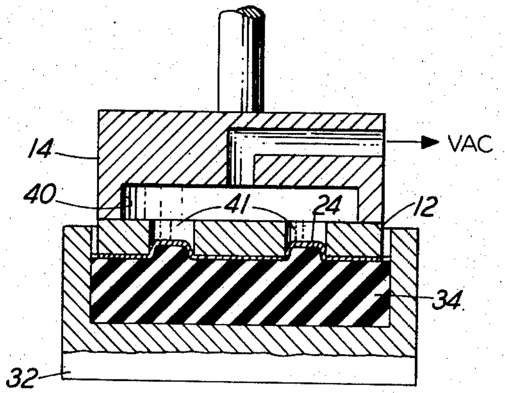
FIG. 3 is an enlarged view of a portion of the apparatus of FIG. 1 in a configuration in which a compliant member is being deformed.

The cylinder 18 is then retracted and the shuttle table 20 is moved to the extreme left position. With the shuttle table 20 in the extreme left position, the support member 32 is positioned on the bonding axis 16. As shown in FIG. 3, the cylinder 18 is again lowered and the compliant member 24, which is being held in place by vacuum against the grid 12, is urged against the elastomeric pad 34. The pad 34 yields to the pressure exerted by the grid 12. However, the portions of the elastomer pad 34 which are aligned with the apertures 41 are not subjected to the pressures exerted by the grid 12. As a result, these portions of the pad 34 flow elastically into the apertures 41 as downward motion of the ram 14 and grid 12 continues. These flowing portions of the pad 34 deform the compliant member 24 upwardly into the apertures 41. When the desired amount of deformation of the compliant member 24 is achieved, the cylinder 18 is stopped and retracted.

The shuttle table 20 is then moved to its mid position with the support member 26 substantially aligned on the bonding axis 16, as shown in FIG. 1.

The device 30 and the compliant member 24 can be viewed simultaneously by an operator through an optical system, designated generally by the numeral 42. The optical system 42 includes a conventional beam splitter 43 which simultaneously projects an image of the devices 30 and the compliant member 24. The images are viewed through a conventional microscope, not shown, which is focused on the beam splitter 43.

An operator, while viewing the devices 30 and the compliant member 24, adjusts the position of the support member 26 with respect to the bonding axis 16 by shifting a manipulator assembly 45 as necessary. After alignment is achieved, the beam splitter 43 swings away to leave a clear path between the ram 14 and the substrate 28. The ram 14 is then lowered to bond the devices 30 to the substrate 28. The time-pressure-temperature combination needed for sound bonding is described in the above-mentioned U.S. Pat. No. 3,533,155.

Figure 4:
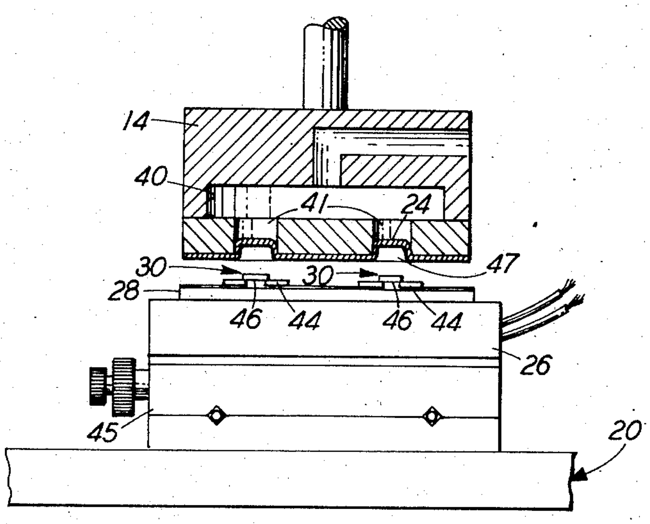
FIG. 4 is an enlarged view of a portion of the apparatus of FIG. 1 shown in a configuration just prior to the apparatus achieving bonding.

As shown in FIG. 4, the compliant member 24 is deformed into the apertures 41 of the grid 12 so that leads or bonding portions 44 of the devices 30 can be contacted by the compliant member, while body portions 46 of the semiconductor device 30 are not contacted when the ram 14 is lowered to apply bonding force.

FIG. 4 illustrates cavities 47 which permit a total clearance of the body portion 46 as provided by the preliminary deformation of the compliant member 24. Provision of total clearance, of course, completely precludes any risk of damage to the body portions 46 during bonding. There are, at times, however, advantages to not providing total clearance.

Figure 5:
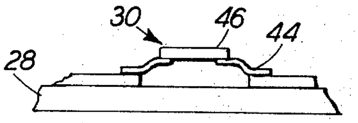
FIG. 5 is an enlarged view of a semiconductor device bonded to a substrate, illustrating a phenomenon known as "bugging"

For example, FIG. 5 illustrates one of the semiconductor devices 30 after bonding has occurred with no forces being exerted on the body portions 46. It can be seen that the body portion 46 is lifted slightly from the substrate 28 to which the semiconductor device 30 has been bonded. This lifting is a phenomenon associated with distortions of the leads 44 which occur during application of bonding forces. This phenomenon is often referred to as "bugging."

A certain degree of "bugging" is desirable at times because the semiconductor devices 30 are often encapsulated with a silicon resin which must flow under the devices. However, an excessive amount of "bugging" provides an excessively fragile structure. In other words, if the chip is lifted too high, there is too great a risk of one or more of the leads 44 being broken by some subsequent mechanical disturbances causing displacement of the body portion 46. Therefore, it is desirable to control the degree of "bugging." This inventive method of compliant bonding provides an opportunity for achieving this desired control of "-bugging."

Control of "bugging" can be achieved by making the cavities 47 in the compliant member 24 (FIG. 4) slightly smaller than that which would provide for total clearance of the body portion 46. The amount of pre-deformation achieved by pressing the compliant member 24 against the pad 34 can be controlled so that the cavity 47 formed in the compliant member 24 will not fully accommodate the body portion 46. When bonding takes place with the compliant member 24 having cavities 47 with such limited deformation, the material of the compliant member within the cavity exerts forces on the body portion 46 tending to hold the body portion against the substrate 28. A full range of cavity depths can be achieved from complete clearance to no depth at all. If a device is bonded with a compliant member having no pre-deformation, minimum "-bugging" will be achieved. As described previously, if the cavity 47 is enlarged to the extent where total clearance of the body portion 46 occurs, then maximum "bugging" will occur. Between these two extremes a complete range of "bugging" can be achieved by controlling the depth of the cavity 47 in the compliant member 24.

If it is desired to operate the inventive apparatus under circumstances wherein the cavity 47 is shallow, one can preclude damage to the body portion 46 by making the compliant member 24 thin and flexible so that the compliant member will deform into the apertures 41 during bonding.

It has been determined that aluminum having a thickness of between 0.001 and 0.002 inch functions satisfactorily in this way. Since the leads 44 are 0.0005 inch thick, the aluminum cannot be made thinner than 0.001 inch for bonding this type of device. If the aluminum were thinner, shearing of the oxide coating of the compliant member might occur and the compliant member might actually bond to the leads, an obviously undesirable result.

Figures 6, 7:
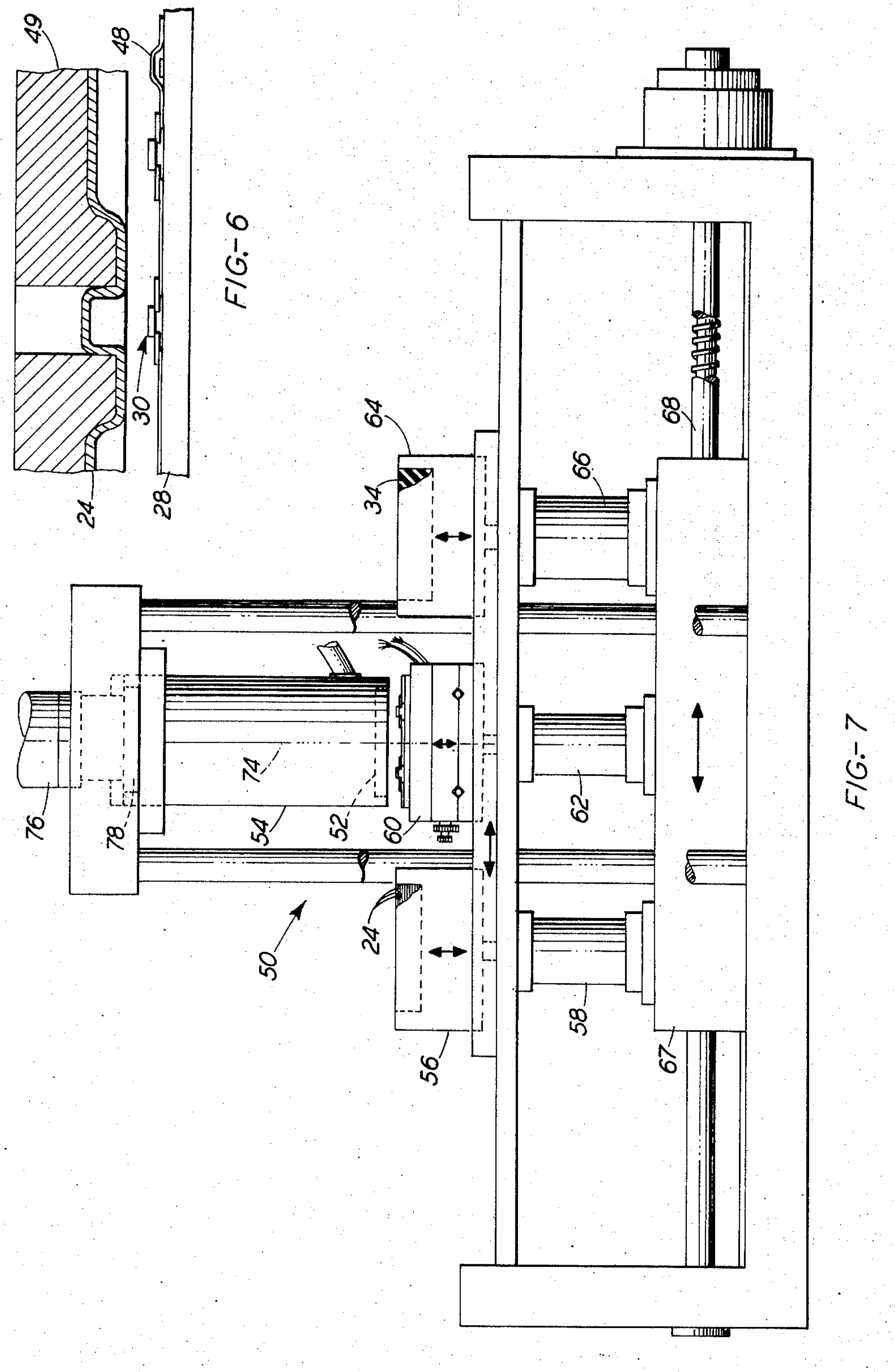
FIG. 6 is an illustration of a bonding situation wherein a semiconductor device is being bonded next to one which is already in position and illustrating a particularly advantageous aspect of the inventive bonding method.
FIG. 7 is an elevational view of bonding apparatus useful for practicing an alternate method of the invention.

In some circumstances, it is desirable to bond one of the semiconductor devices 30 near a position on the substrate 28 where another device is already bonded, or where a crossover 48 in the conductor pattern may exist, as shown in FIG. 6. It is extremely important in these circumstances to localize the bonding forces so that the already positioned device 30 or crossover 48 is not subjected to the forces associated with the bonding of the new device. Compliant bonding in these circumstances has heretofore been accomplished with a so-called "Mesa" compliant member in which the compliant member was of a nonuniform thickness. Such "-mesa" compliant members are extremely expensive to fabricate since they can be formed only by etching processes.

The inventive method and apparatus, however, readily accommodates itself to this type of bonding operation because a "mesa" grid member 49 can be formed into the desired shape and the compliant member 24 can be made of a uniform thickness which will comply to the outer surface of the "mesa" shaped grid. The fabrication cost associated with achieving the "mesa" configuration are expended only once in making the grid 49 rather than numerously, as was the case when single-use compliant members were required to be formed in a mesa configuration.

ALTERNATE EMBODIMENT

It should be noted that in the apparatus of FIG. 1, the alignment of the device 30 to the apertured grid 12 takes place by using the optical system 42 which permits an operator to view the bonding surface of the compliant member 24 and the bonding portions of the semiconductor devices 30 simultaneously. Such optical devices, while they are well known and are fully workable are, in some circumstances, cumbersome. When it is desired to eliminate such a swing-away type of optical device, an alternate embodiment of the inventive apparatus can be utilized.

FIG. 7 illustrates such an alternate embodiment. A bonding machine, designated generally by the numeral 50, is assembled so that an apertured grid 52 is mounted in a frame 54. A support 56 for a stack of the compliant members 24 is adapted for vertical movement under the influence of a cylinder 58. Similarly, a support 60 for the substrate 28 is adapted for vertical movement under the influence of a cylinder 62. The cylinder 62 is capable of providing sufficient force to achieve the necessary bonding pressures, as described in the aforementioned U.S. Pat. No. 3,533,155.

The elastomeric pad 34 is mounted on a support 64 adapted for vertical movement under the influence of a high-force cylinder 66. The cylinder 66 is much larger than the cylinder 58 and 62 and is capable of exerting force in the order of magnitude of tons.

In operation, a table 67 on which the supports 56, 60 and 64 are mounted is moved along rails 68 to position the support 56 directly below the frame 54. The support 56 is lifted to place the topmost one of the compliant members 24 into contact with the apertured grid 52. The frame 54 is internally hollow and is connected to a source of vacuum. (The structure of the frame 54 and grid 52 can be seen in FIGS. 8 and 9.) Vacuum force exerted through apertures 70 picks up the compliant member 24 and engages it with the grid 52.

Figure 8:
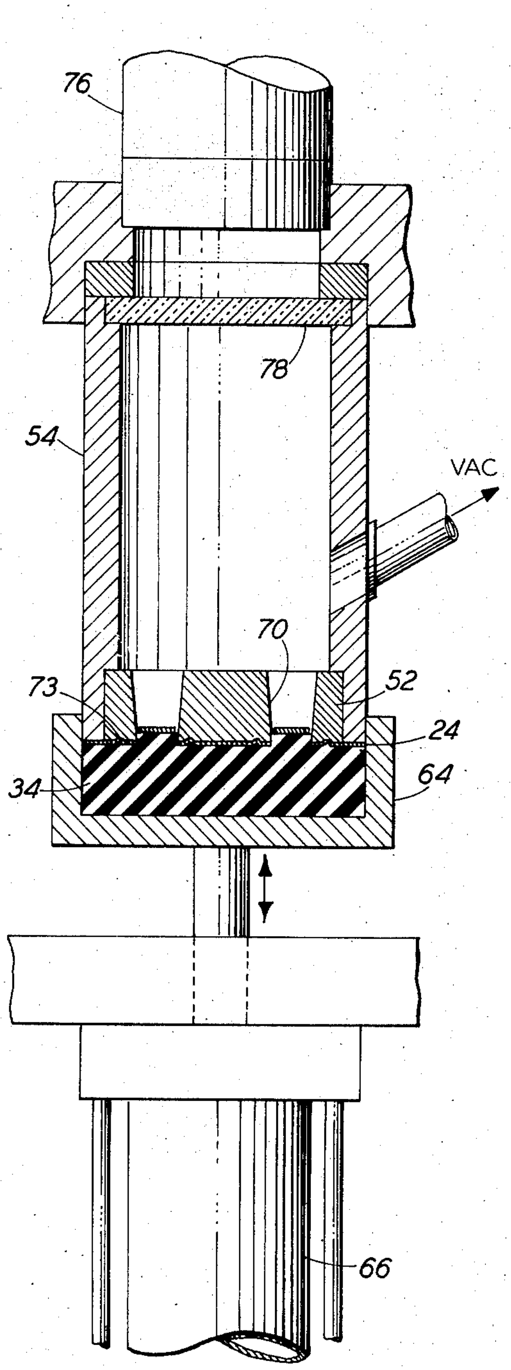
FIG. 8 is an enlarged view of a portion of the apparatus of FIG. 7, showing the apparatus in a compliant-member shearing configuration.

The table 67 is moved laterally along the rails 68 until the elastomeric pad 34 is positioned directly below the frame 54. The cylinder 66 is actuated to drive the pad 34 into engagement with the compliant member 24, as shown in FIG. 8. The elastomeric pad 34 is pressed against the compliant member 24 and grid 52 with such a force that actual shearing of the compliant member occurs at the edges of the apertures 70. This type of shearing is often referred to as "-hydroforming" or the "Guerin process." (See American Society of Tool Engineers "Die Design Handbook" 1955, pp. 13-1 through 13-16.)

Since the apertures 70 are quite small, usually 0.040 inch square, it is important to provide the proper combination of shearing force and elastomer characteristics for the pad 34 so that the very small pieces of the compliant member 24 are sheared properly. One example of such a combination that resulted in proper shearing was provided by utilizing butadiene styrene (GRS) having a hardness of 90 on the Durometer A scale and having a thickness of one-fourth inch. Force exerted on the elastomeric pad 34 was 35 tons.

Figure 9:
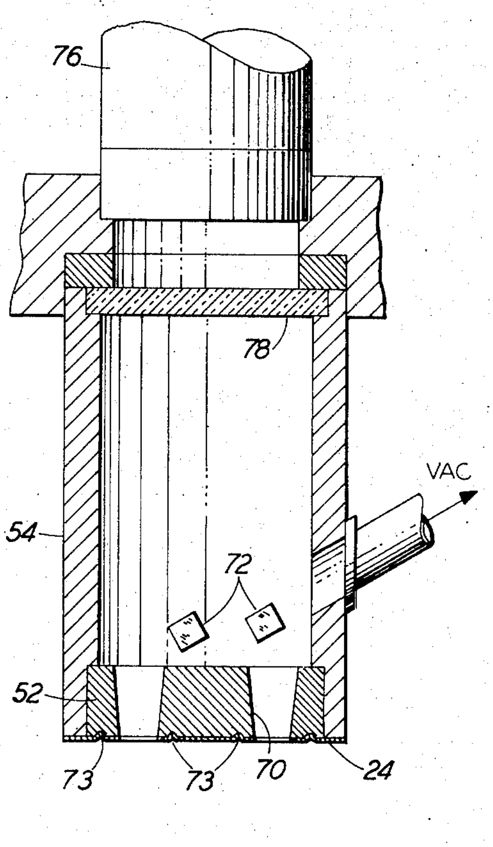
FIG. 9 is an enlarged view of a frame portion of the apparatus of FIG. 7, showing a sequence of operation immediately subsequent to the operation shown in FIG. 8.

After shearing has occurred, the support 64 is lowered and the elastomeric pad 34 is disengaged from the grid 52. Chips 72 of the compliant member 24 are drawn out of the apertures 70 by a flow of air resulting from the vacuum within the frame 54, as shown in FIG. 9. The chips 72 continue out through the connecting tube to the vacuum source where they are collected in a conventional trap, not shown. Thus, the removal of the chips 72 is accomplished on a continual basis and the frame 54 need not be dismantled to remove the chips.

Detents 73 are provided in the surface of the grid 52 to assure that the member 24 adheres to the grid after the shearing.

After the compliant member 24 has been sheared, the support 60 is positioned onto a bonding axis 74, as shown in FIG. 1. An optical unit 76, such as a microscope or television camera, is positioned on the bonding axis 74. A transparent member 78 is provided in the upper portion of the frame 54 to enable direct viewing of the workpieces through the frame and the now apertured compliant member 24. By such a direct viewing, the compliant member 24 can be aligned with the substrate 28 and the semiconductor devices 30 without the need for a movable optical system such as that which is necessary on the machine 10, shown in FIG. 1.

After alignment, the support 60 is raised to effect bonding between the devices 30 and the substrate 28. The time-pressure-temperature combination needed for sound bonding is described in the above-mentioned U.S. Pat. No. 3,533,155.

The compliant member can be removed from the grid 52, after bonding, either manually or by providing the grid 52 with conventional ejection pins (not shown).

Although certain embodiments of the invention have been shown in the drawings and described in the specification, it is to be understood that the invention is not limited thereto, is capable of modification and can be arranged without departing from the spirit and scope of the invention.

What is claimed is:

1. In a method of compliantly bonding beam-leaded semiconductor articles with brittle body portions to a substrate, the improvement which comprises the step of:

deforming a compliant member into an aperture of a bond-force producing member during a bonding sequence to provide clearance for the brittle portion of the device whereby bonding forces can be transmitted through said compliant member to the beam leads without causing damage to the brittle body portion wherein the deformation of the compliant member is accomplished prior to engaging the member with the article to be bonded.

2. The method of bonding of claim 1 wherein the deformation is achieved by pressing the bond-force producing member and a compliant member engaged therewith against an elastomeric member whereby the elastomeric member yields and effects said deformation of the compliant member into the apertures.

3. A method of bonding a first workpiece having a brittle body portion and a ductile bonding portion to a desired location on a second workpiece, which comprises:

engaging an expendable compliant member with an apertured bond-force producing member;

deforming a portion of the engaged compliant member into the aperture of the bond-force producing member;

aligning the brittle body portion of the first workpiece with the deformed portion of the compliant member;

engaging the aligned compliant member with the bonding portion of the first workpiece; and applying sufficient heat and force to the compliant member to effect a thermocompression bonding of the first workpiece to the second workpiece while limiting the application of such force to portions of the compliant member other than the deformed portion, whereby the brittle body portion is left undamaged.

4. The method of bonding of claim 3 wherein the step of deforming a portion of the compliant member is accomplished by forcing the compliant member engaged with the apertured bond-force producing member against an elastomer member.

5. The method of bonding of claim 4 wherein the deformation of the compliant member is limited to the extent that some force is transmitted to the body portion during bonding and "bugging" of the workpieces is reduced.

6. The method of bonding of claim 4 wherein the compliant member is pressed against the elastomeric member with sufficient force to cause shearing of the compliant member around the periphery of the aperture whereby the compliant member can be aligned with the workpieces by direct viewing through the opening produced by said shearing.

7. The method of claim 6 wherein the elastomeric member is formed of butadiene-styrene having a hardness of 90 on the Durometer A scale.

8. In apparatus for compliantly bonding beam-leaded articles having fragile body portions to a substrate, the improvement which comprises:

a bond-force producing member having an aperture formed in a bonding face thereof large enough to accommodate a body portion of the article;

means for engaging an unformed compliant member with said bonding face; and means for deforming a compliant member into an aperture of a bond-force producing member to provide clearance for the fragile body portion of the article whereby bonding forces can be transmitted through said compliant member to the beam leads without damaging the body portion, said means for deforming the compliant member comprising an elastomeric member against which may be pressed the bond-force producing member and the compliant member whereby the elastomeric member yields and effects said deformation of the compliant member into the apertures.

9. An apparatus for bonding a first workpiece having a brittle body portion and a ductile bonding portion to a desired location on a second workpiece, which comprises:

means for engaging an expendable compliant member with an apertured bond-force producing member;

means for deforming a portion of the engaged compliant member into the aperture of the bond-force producing member;

means for aligning the brittle body portion of the first workpiece with the deformed portion of the compliant member;

means for engaging the aligned compliant member with the bonding portion of the first workpiece; and means for applying sufficient heat and force to the compliant member to effect a thermocompression bonding of the first workpiece to the second workpiece while limiting such force to portions of the compliant member other than the deformed portion, whereby the brittle body portion is undamaged.

10. The apparatus for bonding of claim 9 wherein the means for deforming a portion of the compliant member further comprises an elastomeric member against which the compliant member engaged with the apertured bond-force producing member may be forced to effect deformation.

11. The apparatus for bonding of claim 10 wherein the means for deformation further comprises means for pressing the compliant member against the elastomeric member with sufficient force to shear the compliant member around the periphery of the aperture whereby the compliant member can be aligned with the workpieces by direct viewing through the opening produced by said shearing.

12. The apparatus of claim 11 wherein the elastomeric member is formed of butadiene-styrene having a hardness of 44 to 90 on the Durometer A scale.

* * * * *